United States Patent [19]
Gordon

[11] Patent Number: 4,637,685
[45] Date of Patent: Jan. 20, 1987

[54] HIGH POWER, BROAD AREA, MONOCHROMATIC LIGHT SOURCE

[75] Inventor: Eugene I. Gordon, Convent Station, N.J.

[73] Assignee: AT&T Bell Laboratories, Murray Hill, N.J.

[21] Appl. No.: 511,848

[22] Filed: Jul. 8, 1983

[51] Int. Cl.$^4$ ............................................. G02B 6/36
[52] U.S. Cl. .............................. 350/96.20; 350/96.10
[58] Field of Search ............... 350/96.15, 96.20, 96.10; 250/227

[56] References Cited

U.S. PATENT DOCUMENTS 4,069,463  1/1978  McGroddy et al. ............ 372/50 X

OTHER PUBLICATIONS

"LED Array Package for Optical Data Links", Albanese et al, The Bell System Technical Journal, Mar. 1979.

Primary Examiner—William L. Sikes
Assistant Examiner—Akm E. Ullah
Attorney, Agent, or Firm—Michael J. Urbano

[57] ABSTRACT

To achieve a high power, large area, substantially monochromatic solid-state light source, the outputs of hundreds of discrete injection lasers are combined. For the combination, each laser is butt coupled to one end of its separate large core multimode fiber. Groups of fibers are packaged in linear arrays in separate ribbon cables and the ribbon cables are stacked in a two-dimensional rectangular array. The free ends of the fibers terminate in a common plane to make available, at such plane, a high power, large area, source of light. In one embodiment, separate fibers are coupled to the two ends of each injection laser to utilize the light emitting at both facets of the laser.

7 Claims, 3 Drawing Figures

HIGH POWER, BROAD AREA, MONOCHROMATIC LIGHT SOURCE

TECHNICAL FIELD

This invention relates to high power, broad area laser sources.

BACKGROUND OF THE INVENTION

In some special situations there is need for efficient, reliable, high intensity, broad area, essentially monochromatic, light sources. For example, in the optical pumping of a high power, solid-state laser, such as an yttrium aluminum garnet (YAlG) laser, there is a need for a source of substantially monochromatic light of a specific wavelength, and of uniform high intensity over a cross section suitable for irradiating the YAlG crystal. The spatial coherence is not a requirement of such a source. Average power levels of many kilowatts are sometimes required. While at some specific wavelengths, there are available lasers of high average power, such as carbon dioxide lasers; at other specific wavelengths needed for pumping, lasers of high power may be unavailable.

SUMMARY OF THE INVENTION

The invention provides an arrangement for combining many, e.g., thousands, of low intensity lasers to provide essentially a single high power, board area, monochromatic source.

In a preferred embodiment, the invention comprises a large number of linear laser arrays, each array containing perhaps 50 closely spaced lasers on a single chip and each laser providing light of a wavelength suitable for the desired application, although only at considerably lower output power than desired for the application. Each of these laser arrays is butt coupled to one end of a ribbon comprising a plurality of separate large core, high numerical aperture multimode optical fibers—one fiber in the ribbon for each laser in the linear array. The output end of each ribbon constitutes a high intensity, small area, rectangular light source. The various ribbons are stacked to form a large area, two-dimensional, e.g., rectangular, array of thousands of fibers. The free ends of the fibers, which terminate in a common plane, provide the desired concentrated source of substantially monochromatic light desired for the pumping source. For example, if each laser is made to provide only 200 milliwatts of power, there nevertheless can be made available a source of thousands of watts of high intensity, essentially monochromatic light, with the problem of dissipating the heat from each laser considerably relaxed.

DETAILED DESCRIPTION

Figure 1:
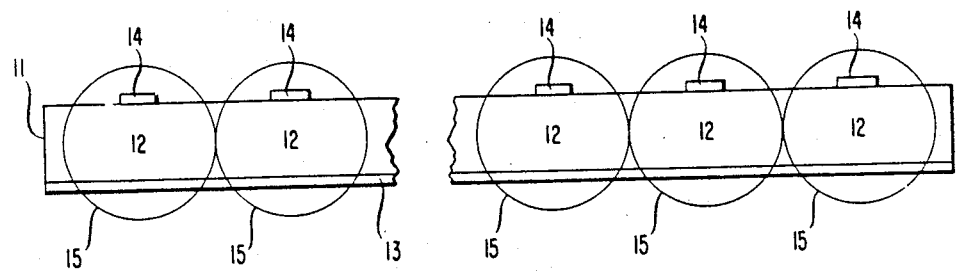
FIG. 1 shows a portion of a linear array of lasers in a wafer butt coupled to an array of optical fibers in a ribbon cable.

With reference now more specifically to the drawing, FIG. 1 shows a semiconductive chip 11 in which are formed a linear array of injection lasers 12 of any of the various structures known, capable of providing laser light of the desired wavelength. In an embodiment designed to pump a YAlG laser, the laser uses as the lasing medium AlGaAs to provide output light which predominantly has a wavelength between 0.808 and 0.81 micron (9% Al). Normally, a large wafer would be processed to include a two-dimensional array of lasers and the wafer would later be cut up to provide a number of chips, each with an individual laser. In this instance the wafer is cut up only to the extent necessary to provide chips which include a linear array of lasers, typically about 50 lasers, aligned in a row with a center-to-center spacing of about 200 microns. It is an advantage of the invention that not all fifty of the lasers in the array need to be operating, since a small number of defective lasers can be tolerated, a factor which should result in decreased cost. In known fashion, one surface of the wafer is provided with one large area plating 13 to serve as a common electrode and heat sink for all of the lasers in the linear array, and the opposite surface is provided with a plurality of conductive stripes 14 disposed to provide current flow through the wafer selectively confined laterally through the active region. Each of these strip electrodes can be tied together electrically so that the operating voltage may be applied between the large area electrode and the plurality of stripes. In operation, light would be emitted in a direction normal to the plane of the drawing, primarily from the active regions of the chip. High numerical aperture, typically 0.6, optical fibers 15 are used to collect the exiting light. Each of the fibers includes one end which is butt coupled to an active region of the wafer to capture the exiting light.

Two modes of operation are possible. In one mode, emission from each of the two opposed surfaces of the optical cavity of each laser is collected for utilization by coupling a separate fiber to each such surface. In an alternative mode, emission out of only one of the two surfaces is collected for utilization. In such alternative mode, it may be advantageous to provide a reflecting coating on the surface from which emission is not being collected to reduce the amount of such emission, and direct it to the output facet. The internal losses in the cavity prevent doubling of the output power. Hence, this configuration is not as efficient as the former.

For collection of the emission exiting from a particular laser, its associated fibers are butt coupled to the laser at each region of exit. Each fiber can be of the step-index type able to provide relatively low loss transmission of the laser light from the point of exit to the point of utilization. Since this distance normally will be short, relatively inexpensive fibers can be used without incurring significant losses. It is advantageous to use fibers of relatively large core and high index difference to ensure capture in the core of most of the laser light emitted at the output of the laser.

For example, suitable fibers could be made inexpensively by using as a preform a high index glass rod inside a lower index glass tube.

To provide structural support and to facilitate handling, advantageously a number of fibers are assembled in a linear array which corresponds to the number and spacing of lasers in the array chip, the array of fibers is packaged in a ribbon cable of a suitable material and one cable would be coupled to one chip. In the specific example, fifty fibers would be incorporated in one ribbon cable with 200-micron center-to-center spacing, resulting in a ribbon width of about one centimeter for coupling to the chip of fifty lasers, previously described. It is advantageous to assemble the chip and a short coupling length of the ribbon cable together in a unitary package, while the remainder of the ribbon cable is free of the package to permit it to remain flexible for stacking with other similar ribbon cables.

Figure 2:
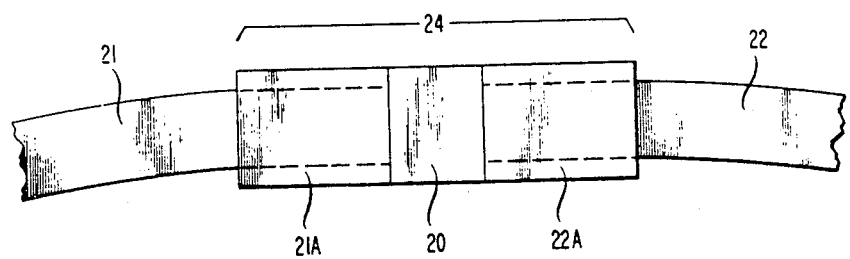
FIG. 2 shows a package containing the linear array of lasers and a pair of fiber ribbons, one ribbon for each light exiting surface of the wafer.

As explained above, in one mode of operation a separate ribbon cable would be butt coupled to each of the two exiting surfaces of the wafer. Such an arrangement is depicted schematically in FIG. 2 in which the array of lasers in chip 20 are coupled at opposite surfaces to the array of fibers in ribbon cables 21 and 22, respectively. In this instance, coupling portions 21A, 22A of cables 21 and 22 would be assembled in a common package 24 with chip 20, and a portion of the cables extend out of the package.

Figure 3:
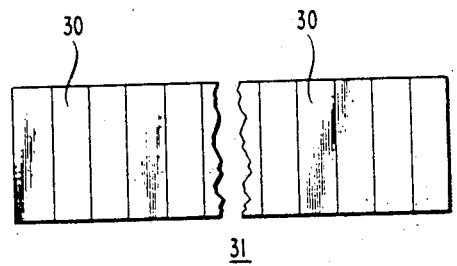
FIG. 3 shows a plurality of ribbon cables stacked to form a rectangular array of fibers to provide a high intensity source in accordance with the invention.

For forming the large area light source, a number of ribbons 30, determined by the area and power desired, are stacked, as shown in FIG. 3, one above the other or side by side to form a two-dimensional or rectangular array of fibers 31. Typically, hundreds, such as five hundred, ribbons could be included in the stack to form an array of 25,000 fibers in a two-dimensional array of about 1 centimeter by 10 centimeters. If each laser were providing 200 milliwatts to each fiber, 5,000 watts would be available. Advantageously, the uncoupled or free end of each of the fibers in the two-dimensional array terminates in a common plane so that at such plane there exits and is available the outputs of all the lasers effectively formed into a single light source whose cross section matches that of the rectangular array. This concentration of power is available without a concentration of the heat associated with producing it. For example, producing 5,000 watts of light from semiconductor injection lasers normally requires at least 10,000 watts, necessitating the dissipation of at least 5,000 watts. This would be impractical if the lasers were closely spaced. However, each package of 50 lasers involves dissipation of only about 10 watts, a relatively simple task, if the package can be isolated from other packages for cooling.

By this expedient, there can be combined conveniently in a rugged, easily cooled, structure the output of thousands of individual injection lasers.

Moreover, by utilizing light exiting from both ends of each laser there can be achieved especially high efficiency of operation.

It can be seen that the invention has considerable flexibility. Its primary usefulness, however, is expected to be for applications which require the power of a large number of injection lasers, typically at least a thousand. Moreover, the primary applications will be ones where the cross section of the emitted beam is an area relatively large compared to that of a single injection laser although techniques are available for concentration, for example, by terminating the fibers in different ribbons in different planes. At the present stage of technology, it is relatively easy to provide on a common chip a linear array of at least several tens of injection lasers, e.g., fifty. In time it may become feasible to form hundreds in one chip in which case it may be advantageous to utilize such chips, since the larger the array in one chip, the less should be the final cost of the pump array. It can also be appreciated that with such chips it may be preferable to utilize several ribbon cables. Alternatively, in some instances of chips with a smaller number of lasers, it may be preferable to associate several chips with each cable for packaging. It can be appreciated that the invention is essentially independent of the type of the injection laser.

What is claimed is:

1. A high power large area substantially monochromatic light source comprising a plurality of chips, each chip including a linear array of at least several tens of injection lasers, all of said lasers emitting light at essentially the same time, a plurality of ribbon cables, each cable including a linear array of at least several tens of optical fibers, each of said linear arrays of fibers being coupled to said linear arrays of injection lasers on a one-to-one relationship, and the plurality of ribbon cables being assembled to form a two-dimensional array of fibers whose uncoupled ends terminate in a common plane to form an emitting source.

2. A light source in accordance with claim 1 in which each fiber is a step index fiber whose core is adapted to capture most of the light emitted from the end of the injection laser to which it is coupled.

3. A light source in accordance with claim 1 in which each end of the injection lasers in a linear array is coupled to a separate fiber and all the coupled fibers are included in the two-dimensional array.

4. A light source in accordance with claim 1 in which at least one thousand fibers are included in the two-dimensional array.

5. A light source comprising a plurality of semiconductive chips, each chip including a plurality of injection lasers arranged in a linear array, each laser emitting at substantially the same wavelength, all of said lasers emitting light at essentially the same time, a plurality of ribbon cables each having coupling portions at one end, each cable including a plurality of optical fibers in a linear array, each chip being butt coupled to a ribbon cable with one laser being coupled to one optical fiber, the chip and the coupling portions of the ribbon cable being assembled in a unitary package and the other ends of the ribbon cables being arranged to form a two-dimensional array of fibers each emitting light of substantially said same wavelength at its end.

6. The source of claim 1 wherein each laser has two output ends and a separate fiber is coupled to each of said two ends of each laser, and all such fibers are included in said two-dimensional array.

7. The source of claim 5 wherein each laser has two output ends and a separate fiber is coupled to each of said two ends of each laser, and all such fibers are included in said two-dimensional array.

* * * * *